United States Patent
Seal et al.

(10) Patent No.: US 8,441,780 B2
(45) Date of Patent: May 14, 2013

(54) UTILITY-GRADE ENCLOSURE FOR INCORPORATION OF NETWORK COMMUNICATION DEVICES

(75) Inventors: Robert Bryan Seal, Meridian, MS (US); Charles W. Melvin, Jr., Dudley, GA (US)

(73) Assignee: Itron, Inc., Liberty Lake, WA (US)

( * ) Notice: Subject to any disclaimer, the term of this patent is extended or adjusted under 35 U.S.C. 154(b) by 454 days.

(21) Appl. No.: 12/899,460

(22) Filed: Oct. 6, 2010

(65) Prior Publication Data

US 2012/0050971 A1    Mar. 1, 2012

Related U.S. Application Data

(60) Provisional application No. 61/377,003, filed on Aug. 25, 2010.

(51) Int. Cl.
H05K 5/00 (2006.01)
H05K 7/00 (2006.01)
G02B 6/00 (2006.01)

(52) U.S. Cl.
USPC ....... 361/679.01; 361/601; 385/134; 385/135

(58) Field of Classification Search ............. 361/679.01, 361/679.02, 601; 385/134, 135
See application file for complete search history.

(56) References Cited

U.S. PATENT DOCUMENTS

| 5,880,677 | A  | * | 3/1999  | Lestician  | 340/3.1 |
| 7,200,317 | B2 | * | 4/2007  | Reagan et al. | 385/139 |
| 7,457,503 | B2 |   | 11/2008 | Solheid et al. | |
| 7,522,876 | B1 |   | 4/2009  | Meitzen et al. | |
| 7,589,630 | B2 | * | 9/2009  | Drake et al. | 340/539.26 |
| 2005/0129379 | A1 | | 6/2005 | Reagan et al. | |
| 2007/0138275 | A1 | | 6/2007 | Hall | |
| 2008/0174424 | A1 | | 7/2008 | Drake et al. | |
| 2009/0324187 | A1 | * | 12/2009 | Wakileh et al. | 385/135 |
| 2010/0049822 | A1 | | 2/2010 | Davies et al. | |

FOREIGN PATENT DOCUMENTS

WO    2006083958 A2    8/2006

* cited by examiner

*Primary Examiner* — Anthony Haughton
(74) *Attorney, Agent, or Firm* — Dority & Manning, P.A.

(57) ABSTRACT

In one embodiment, an enclosure for electronic circuit boards and components is disclosed. The enclosure has a closable, weather-resistant housing that is sized and shaped to receive mounted circuitry in an enclosed space that is defined by a back wall and side walls extending outwardly from the back wall. The housing includes a detachable cover for covering and sealing the enclosed space. In one embodiment, the circuitry includes a planar electronic circuit board that is mounted within the enclosed space. The planar electronic circuit board has a subsection of power supply circuitry that is operative to receive electrical power from outside of the enclosure. The circuitry further includes power supply transformers and capacitors that operate from power received from outside the housing, and data processing and communications components that include a data processor and a data bus. The data bus is coupled to electronic circuit connectors. The enclosure is configured such that the electronic circuit board is exposed to an external environment when the cover is detached.

47 Claims, 11 Drawing Sheets

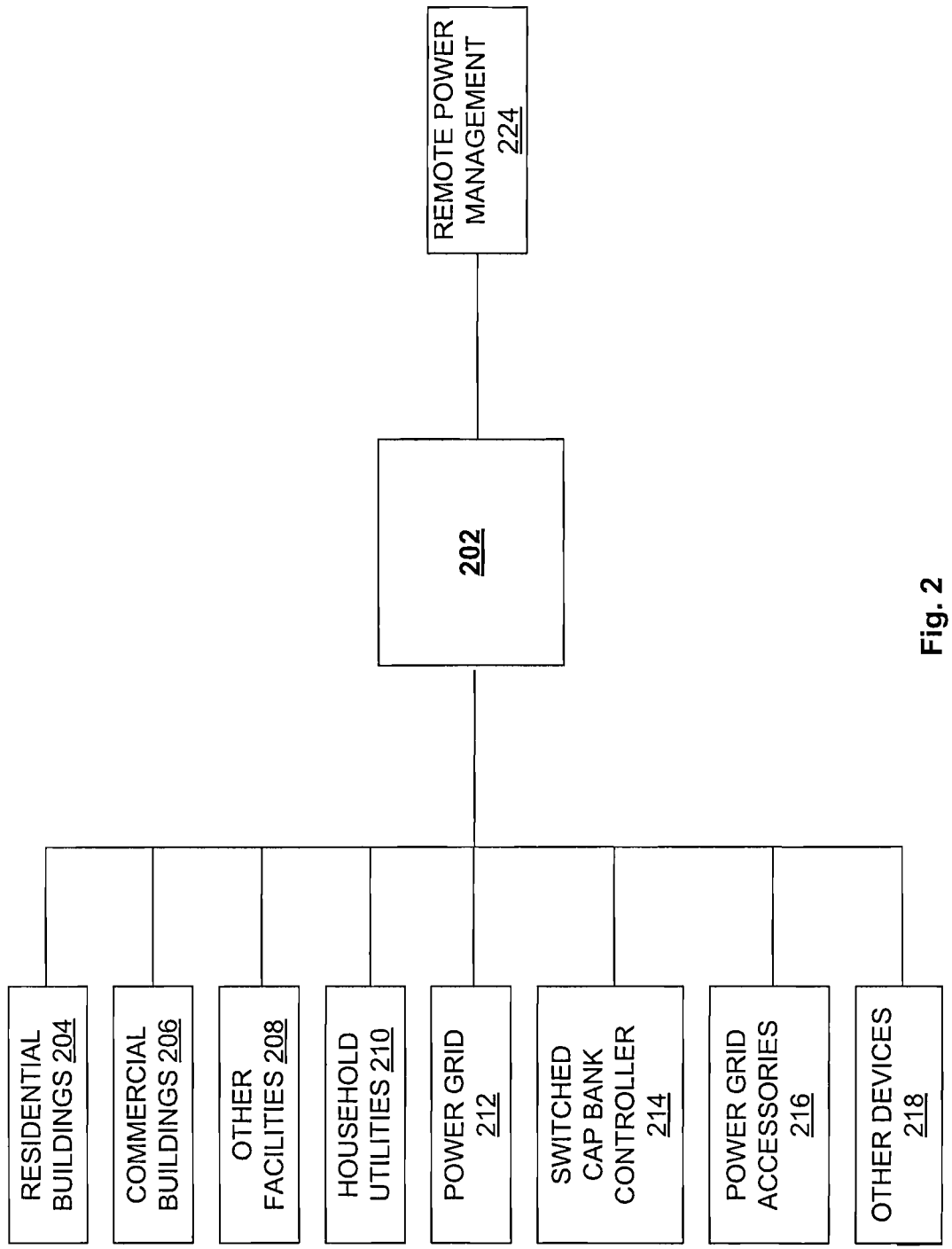

UTILITY-GRADE ENCLOSURE FOR INCORPORATION OF NETWORK COMMUNICATION DEVICES

CROSS REFERENCE TO RELATED PATENT APPLICATION

This application claims the benefit, pursuant to 35 U.S.C. §119(e) of U.S. provisional Application Ser. No. 61/377,003, filed Aug. 25, 2010, entitled "Utility-Grade Intelligent Device for Incorporation of Network Communication Devices" by Robert B. Seal and Charles W. Melvin, the disclosure for which is hereby incorporated by reference in its entirety.

FIELD OF THE INVENTION

The present invention generally relates to network routers, and more specifically to an intelligent communications device for a smart grid, hereinafter also referred to as an "apparatus" or "network apparatus", for managing interconnection of various electrical devices and facilities.

In one aspect, the present invention relates to a utility-grade enclosure for incorporation of network communication devices.

SUMMARY OF THE INVENTION

In one aspect, the present invention relates to electronic devices in a smart grid. In one or more exemplary embodiments, an intelligent communications device is operatively connected with other devices and/or systems and one or more electrical distribution networks. One or more of these electronic devices may work in collaboration with the intelligent communications device in a smart grid network infrastructure. In one or more embodiments, the electronic devices may be arranged in various configurations to operate in networks such as LAN, WAN, and/or HAN networks.

In one embodiment, the intelligent communications device is configured with other devices and/or monitoring equipment for monitoring and management of electrical energy consumption. The intelligent communications device operates on wireless communications networks and according to one or more wireless protocols such as commercial cellular, Bluetooth, and/or 802.11.

In one embodiment, the intelligent communication device is field upgradable, and is configured such that additional hardware can be installed for enabling new protocols or technologies to be developed. The intelligent communications device is operative to implement open source software configured to facilitate integration of different types of devices with additional circuitry and/or hardware. Further, the intelligent communications device is operable to update the open source software periodically or at a pre-defined time.

In one or more other aspects, the present invention relates to an enclosure for electronic circuit boards and components.

BRIEF DESCRIPTION OF THE DRAWINGS

FIG. 2 depicts various facilities, devices and equipment interfaced with an intelligent communications device according with one embodiment of the present invention.

DETAILED DESCRIPTION OF THE INVENTION

Description of the various embodiments detailed below is for understanding the invention. It will be understood that the invention is not limited to the particular embodiments described herein, but is capable of various modifications, rearrangements and substitutions, which will now become apparent to those skilled in the art without departing from the scope of the invention. Therefore, it is intended that the following claims cover all such modifications and changes that fall within the spirit and scope of the invention.

In alternative embodiments, system, process, and apparatus may include additional, fewer, or different components. In addition, the each component may include additional modules, software, and interface devices that may be appended on requirement to operate the present invention in alternate embodiments.

Figure 1:
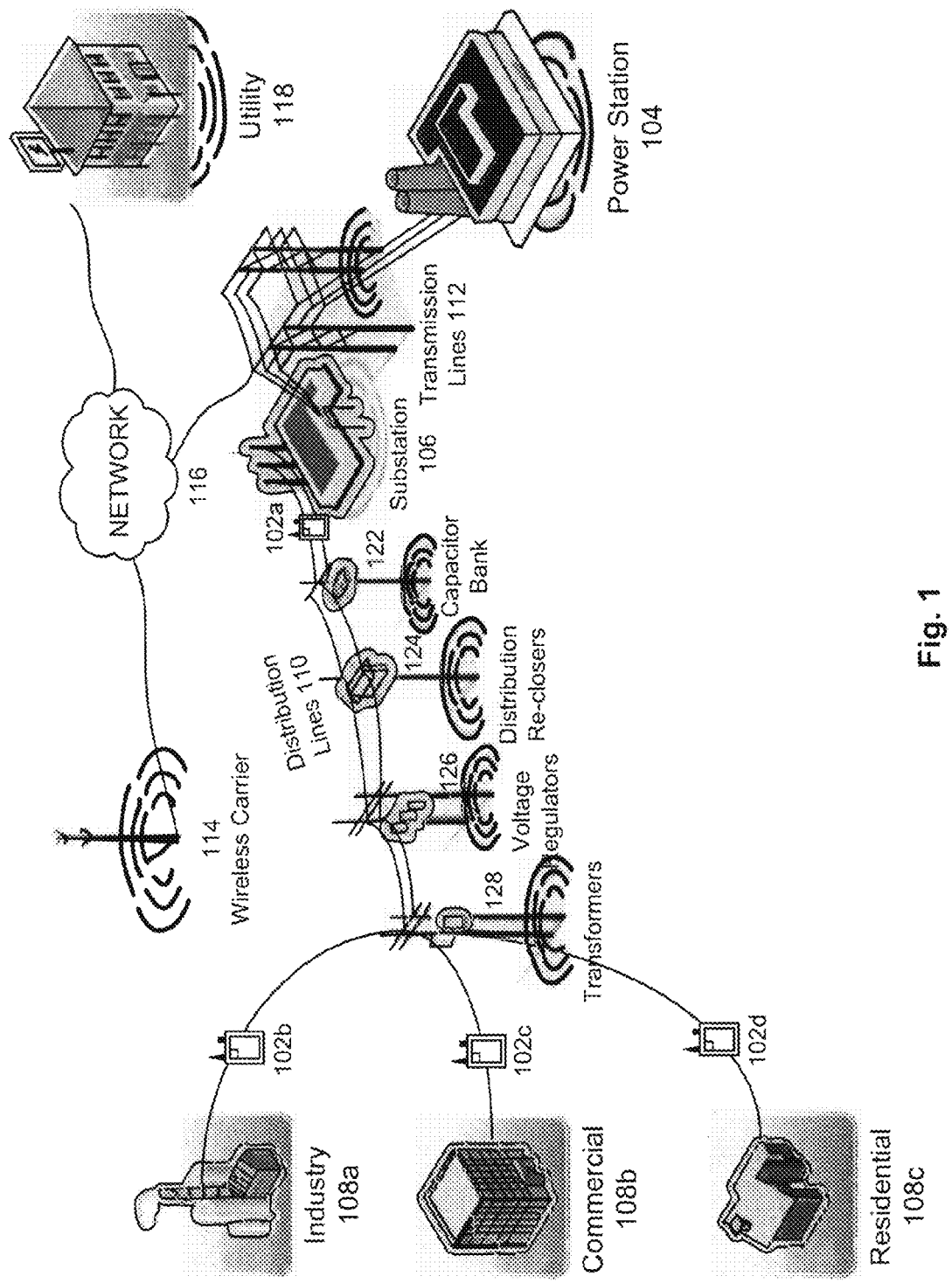
FIG. 1 is a schematic illustration of an overall environment in which one or more aspects of the present invention can be practiced.

Referring to FIG. 1, an intelligent communications device for a smart grid communicatively coupled to a plurality of devices and/or facilities for management of energy requirements is depicted. Integration of the intelligent communications device 102 into the smart grid infrastructure may be performed using minimal capital expenditure.

FIG. 1 illustrates an environment in which the present invention may be practiced. The environment may include a plurality of electrical generation facilities such as thermal power plants, hydro-based power plants (dams, for example), solar powered electricity generation units, and wind powered electricity generation units. Various electricity-generating plants are collectively referred to as power generation units 104. The electricity generated from the power generation units 104 may be distributed through a plurality of high voltage transmission lines 112 to a substation 106. For example, high voltage electricity may be distributed via plurality of towers and a plurality of medium voltage distribution cables 110.

By way of example and not a limitation in one implementation, the substation 106 may receive power from the plurality of high voltage transmission lines 112 from at least one of the plurality of substations such as power station 104. Further, the substation 106 may be associated with an intelligent communications device 102. The intelligent communications device 102 may monitor various parameters such as quality of electricity and electrical load.

The substation 106 may then distribute low voltage electricity to residential entities 108*c*, industrial entities 108*a*, and/or commercial entities 108*b*. The medium voltage distribution lines 110 may include attachments of various devices for improvement of quality electricity. As such, the plurality of distribution lines 110 may run moderate distances and are affected by cable resistance, electrical grid loading, and other factors which constantly effect the operation and efficiency of the electric grid. In order to compensate for a variety of operating conditions, the plurality of distribution lines 110 may include connections to capacitor banks 122, distribution re-closers 124, voltage regulators 126, transformers 128 and other types of equipment.

The electricity may be supplied to the one or more industrial entities such as industry 108a, via intelligent communications device 102b. Likewise, the plurality of distribution lines 110 may feed electricity to one or more commercial entities such as commercial entity 108b, one or more residential entities 108c, through intelligent communications devices 102c and 102d. Hereinafter, intelligent communications devices 102a, 102b, 102c, and 102d may be collectively referred to as "intelligent communications device 102."

The intelligent communications device 102 may be configured to operate with a central control station, regulatory authority, audit compliance authority, and/or electrical monitoring systems. Apart from monitoring the various parameters such as electrical quality, the intelligent communications device 102 may be coupled wirelessly to a plurality of wireless carriers such as 114. Alternatively, the intelligent communications device 102 may be coupled with communications network 116 using powerline communication. Further, the wireless carrier 114 may receive signals that may be utilized for moderating the distribution of electricity from the substation 106 to industrial entity 108a, commercial entity 108b, and/or residential entity 108c.

The intelligent communications device 102 may be connected with a plurality of utilities in a building, a commercial complex, and/or an industry. By way of example and not a limitation, in one implementation, intelligent communications device 102 may be connected to utility 118. In an embodiment, the utility 118 may include lighting systems, refrigerators, air conditioners, computers, televisions, home theaters, electric irons, water filters, air filters, air compressors, and/or vacuum cleaners. The intelligent communications device 102 may directly control the utility 118. In another embodiment, one or more intelligent communications devices 102 may indirectly control the utility 118. In yet another embodiment, the utility 118 may be partially controlled by one or more intelligent communications devices 102 for modulating the electrical consumption. It may be noted that only one implementation is provided; however, those skilled in the art would appreciate that various other implementations are possible without deviating from the scope and spirit of the invention.

The utility may be grouped into essential and non-essential electrical equipment for purposes of control. In this embodiment, the intelligent communications device 102 may be programmed to monitor the one or more utilities 118 on a rule based program.

In an embodiment of the present invention, the intelligent communications device 102 may be coupled to multiple consumers such as industrial entities 108a, commercial entities 108b, and residential entities 108c. The consumer 108a, 108b, and 108c may be hereinafter collectively referred to as 'consumers 108'. The intelligent communications device 102 may facilitate management of electricity to one or more consumers 108. Additionally, the intelligent communications device 102 may also be integrated to communications backhaul providers that may work in synchronization for accumulating data related to electrical consumption, load distribution, quality of electricity, power factor, and/or failure of equipment associated with the distribution of electricity. The information may be communicated to control and monitoring station, either through the network 116 or through wireless carriers 114.

In an embodiment of the present invention, the consumers 108 may be distributed in a geographically area and may be connected to each other through a smart grid. In addition, each consumer 108a may have one or more smart appliances. The smart appliances may be managed by the intelligent communications device 102 for optimizing electricity consumption.

Referring to FIG. 2 an arrangement of configuring various electrical facilities with an intelligent communications device 202 is shown, according to one embodiment of the present invention. The intelligent communications device 202 may communicate with the plurality of devices and/or facilities, such as but not limited to, residential buildings 204, commercial entities 206, other facilities 208, household utilities 210, power grids 212, switched cap bank controllers 214, grid accessories 216, other devices 218, and remote power management utilities 224. Other facilities 208 may include but not limited to schools, small offices, sports complexes, shops, malls, federal offices, utility complexes, or other types of buildings having electrical connection and consuming electricity. The intelligent communications device 202 may facilitate energy management for one or more of the devices and/or facilities as shown.

Power Management

In an embodiment of the present invention, the intelligent communications device 102 may enable distribution companies to reduce the overall power requirement through better management. This in turn may help in reducing the need for power generation thereby reducing environmental damage. Further, the intelligent communications device 102 may act as a communications hub for monitoring electrical usage, power consumption, quality of electricity, and/or analysis of electrical load, where examples of load type may include inductive load and/or capacitive load. The communications hub may interface various devices in order to monitor electricity consumption and/or power usage.

The intelligent communications device 102 may enable integration of various utilities with the grid for optimizing the overall performance of the system. For example, the load requirement of a particular building may be assessed/monitored using the intelligent communications device 102. The data collected by the intelligent communications device 102 from the various utilities may be utilized for improving the overall electrical consumption of these utilities thereby saving cost and electricity. Alternatively, the intelligent communications device 102 may monitor the performance of different electrical utilities and may facilitate their management in an optimized way.

In another embodiment, the intelligent communications device 102 may be utilized by distribution companies for monitoring the quality of electricity and load characteristics for a specific area. The data recorded by the intelligent communications device 102 may be utilized for increasing the operational efficiency of the power grid.

In another embodiment, the intelligent communications device 102 may facilitate management of demand response for a grid. Currently, power generation and/or power distribution companies face pressure to reduce load either electronically or manually. In such settings, transmission grid operators use demand response to request load reduction in order to manage demand. One or more aspects of the present invention according to this exemplary embodiment allow for transmission grid operators to utilize the intelligent communications device 102 for electronically managing the demand response of electricity.

Integration with Power Grid

In one embodiment, the intelligent communications device 102 may include a communication module for connecting it with a smart grid. In this aspect, the intelligent communications device 102 may increase the performance of the smart grid making it more adaptable and cost effective. In addition, the intelligent communications device 102 may enable utilities to interface with the grid irrespective of the underlying technology, network, or assets. The intelligent communications device 102 may be flexible to accommodate any configuration changes and/or bandwidth changes without affecting the underlying architecture/technology.

In another embodiment of the present invention, the intelligent communications device 102 may communicate with other apparatuses. The communication may be either wireless or through wired connection. Such communication may occur in response to a critical event such as power surge, excess demand, low power factor, when immediate action is required for safeguarding the electrical equipments associated with transmission infrastructure. In another embodiment, the communication between different apparatuses may occur on a continuous basis for optimizing the performance of the system.

Field Upgradability

In another aspect of the present invention, the intelligent communications device 102 may be field-upgradable and may provide field replaceable units for preventing obsolescence. The intelligent communications device 102 may allow utilities to add multiple communication technologies to the smart grid communication infrastructure with change of the underlying technology. By integrating multiple communication technologies, the intelligent communications device 102 may act as a universal hub, to reduce the cost of purchasing additional equipment for implementing multiple network communications protocols. Consumers 108 may integrate multiple appliances and multiple communication technologies using intelligent communications device 102 thereby reducing the total cost of ownership of the equipment. Additionally, consumers 108 may upgrade the intelligent communications device 102 to integrate new communication protocols by just installing additional circuitry without changing existing equipment.

The intelligent communications device 102 may further include a software update module that may connect to the Internet for availability of firmware updates. In response to availability of firmware updates, the software update module may back-up the current firmware before upgrading the intelligent communications device 102 with the new firmware. Failure to implement the new firmware may result in reinstallation of the old firmware from the back up.

In another embodiment of the present invention, the intelligent communications device 102 may include additional slots for inserting PCB boards. These PCB boards may include circuitry for enabling specific protocol, for example, the PCB on PCB board may implement EDGE protocol. Similarly, in another example, a PCB board may implement WiMax protocol. Field service personnel may insert additional PCB boards for upgrading the existing communication protocol without having to replace the intelligent communications device 102. Thus, the intelligent communications device 102 may be upgraded while in operation.

In another embodiment of the present invention, the intelligent communications device for a smart grid may include PCB boards supporting various communication technologies such as but not limited to, WiMax, EDGE, IPv4/IPv6, Bluetooth, Infrared, broadband over powerline, and Ethernet. Software configured in the intelligent communications device 102 may be utilized to enable/disable one or more communication boards. Thus, in one implementation, the apparatus may support Ethernet. In another implementation, the intelligent communications device 102 may support Ethernet and Bluetooth. In these scenarios, the field service personnel may update the intelligent communications device 102 by enabling the boards supporting various communication technologies remotely.

In yet another embodiment of the present invention, the intelligent communications device 102 may include utilities, circuitry for upgrading it on site. Further, the intelligent communications device 102 may include software and/or modules for adding multiple communication technologies to the smart grid communications infrastructure based on future needs without having to replace an entire system backbone. By virtue of having capabilities for adding new devices and facilities, the intelligent communications device 102 may allow consumers to purchase and integrate non-interoperable proprietary technologies from multiple vendors. Vendors may integrate heterogeneous devices using intelligent communications device 102 thereby creating an open environment. In this aspect, the intelligent communications device 102 may allow for consumers to avoid being committed to a specific vendor.

Consumption Monitoring

Consumers of electricity may save money by planning their energy requirements in area implementing Time-Of-Use (TOU) pricing. Consumers may plan the use of electrical appliances in off-peak hours, when the cost of electricity is less, for reducing the total cost of electricity consumption. The intelligent communications device 102 may facilitate the reduction in total consumption of electricity by automatically switching on the electrical appliances in non-peak hours.

Network Protocol Implementation

The intelligent communications device 102 may be based on Internet Protocol (IP) thereby providing seamless integration with different type of networks. For example, the intelligent communications device 102 may facilitate communication with both public and private networks. In embodiments, the network may be either a wired network or a wireless network. Further, networks classified on the basis of scale, such as LAN, WAN, HAN, or functional relationships, such as client server, peer-to-peer, and/or active networks, overlay networks are included within the scope the invention. In an exemplary embodiment, the intelligent communications device 102 communicates using TCP/IP. Likewise, the intelligent communications device 102 may interface with other devices implementing conventional protocols.

The intelligent communications device 102 may facilitate smart grid-enabled appliances to communicate wirelessly with electrical distribution companies to manage their overall consumption of electricity. For example, the intelligent communications device 102 may manage consumption of electricity during peak hours for a distribution network. In this aspect, the intelligent communications device 102 may communicate in real-time with various facilities and other devices to optimize energy efficiency.

In an embodiment of the present invention, the intelligent communications device 102 may include an Ethernet interface for connecting it with external network such as LAN, WAN, or HAN. Further, the Ethernet interface may enable communication with Internet thereby facilitating remote management of utilities. The intelligent communications device 102 may record various parameters such as electricity consumption, power usage and may transfer the recorded data to the remote infrastructure management facility for optimization of the electrical consumption. To this end, the intelligent communications device 102 may enable optimum utilization of the grid infrastructure. The intelligent communications device 102 may be built for outdoor use and may be protected from environmental hazards.

The intelligent communications device 102 may be capable of interfacing with various protocols, networking standards, and other specifications. In an example, the intelligent communications device 102 may facilitate communication by implementing WiMax protocol. In another example, the intelligent communications device 102 may communicate using Bluetooth protocol. In embodiments, the intelligent communications device 102 may communicate using other protocols such as but not limited to token ring, EDGE, UDP, datagram and other proprietary Internet communications protocols. In an example, the intelligent communications device 102 may facilitate communication with ZigBee protocol that allows devices in the home to communicate with a smart meter and neighborhood hub.

In an embodiment of the present invention, the electrical distribution companies may analyze the electrical consumption data collected over a specified period for better management of energy. The intelligent communications device 102 may include a communication link with a database for storing electrical consumption data. In an embodiment, the specified period may be an hour, a day, a month, a year, or any combination of these.

The intelligent communications device 102 may facilitate interoperability among smart grid devices, thereby facilitating seamless deployment of smart devices in a smart grid. In this aspect, various smart devices including smart appliances and smart meters may work in harmony with the intelligent communications device 102. Thus, the intelligent communications device 102 may integrate into the existing smart grid deployment without competing with other existing devices. Alternatively, it may enhance the capability of other smart devices. In an embodiment of the invention, the intelligent communications device 102 may allow integration with other devices without the need for installing additional devices and/or interface circuitry. The smart devices can be configured with the intelligent communications device 102 for management of smart appliances for increasing the operational efficiency of the smart grid. Smart appliances refer to the class of products that enable communication with smart meters and neighborhood hub for saving energy.

The intelligent communications device 102 may enable Internet Protocol based communication involving end-to-end connectivity on a public wireless network. The intelligent communications device 102 may further facilitate two-way delivery of real-time energy usage data over a public wireless network. In an embodiment, the real-time data may include location information along with energy usage information.

In an embodiment of the present invention, the intelligent communications device 102 may include one or more communication ports for connecting to different types of communication devices. The intelligent communications device 102 may include switches, hubs or other interface circuitry for coupling with the external devices. Additionally, the intelligent communications device 102 may include a wireless communication module for connecting with wireless appliances and/or smart devices. In this aspect, the wireless devices such as smart appliances may be enabled by low power protocol such as 6 LOWPAN. Alternatively, the wireless devices may be enabled using Bluetooth, EDGE, IEEE 802.11, and/or infrared.

Open Standards Implementation

The intelligent communications device 102 may implement open standards to leveragie existing programs and tools. In this aspect, the intelligent communications device 102 may facilitate rapid application deployment and delivery of the new functionality. For example, the intelligent communications device 102 may update the applications and/or programs in real time. Additionally, updates corresponding to programs and/or applications may be executed at a predefined time in order to update the software, drivers, interface ports, applications. This may ensure that the intelligent communications device 102 may be fully equipped to deny any security attack on it. In another example, interfacing a new smart device with the intelligent communications device 102 may initiate a search for software. Failure to discover appropriate software may result in searching the required software at a remote location such as the Internet. Thus, the intelligent communications device 102 may perform self-healing by automatically scanning and integrating new devices and/or facilities in the smart grid infrastructure.

Management Tools

The intelligent communications device 102 may be interfaced with standard off-the-shelf network management tools. In an embodiment of the present invention, the management tools may be integrated in one or more utilities. Alternatively, the management tools may be implemented on computing devices such as personal computers, servers, and/or electrical control panels.

The intelligent communications device 102 may work in harmony with other smart devices in order to create a seamless infrastructure and to enhance the capability of the smart grid infrastructure. Thus, the intelligent communications device 102 may allow reclosers from one vendor to be integrated with the electronic meters from another vendor for building a collaborative smart grid infrastructure.

The intelligent communications device 102 may implement open source and may facilitate two-way delivery of real-time energy usage data over public wireless network. Further, the open source may simplify deployment of the smart devices in a smart grid infrastructure.

Security Features

In an embodiment of the present invention, the intelligent communications device 102 may secure communication between the intelligent communications device 102 and the external smart devices. For this purpose, the intelligent communications device 102 may implement various security algorithms as known in the art, including IP security and cryptography for secure transfer of data. Internet Protocol Security (IPsec) is a protocol suite for securing Internet Protocol (IP) communications by authenticating and encrypting each IP packet of a data stream. In another embodiment, the intelligent communications device 102 may implement RSA algorithm for securing data transfer.

In embodiments, the intelligent communications device 102 may facilitate collaboration between various interconnected equipment in the smart grid infrastructure. For example, the intelligent communications device 102 may facilitate collaboration between groups of consumers. In another example, the intelligent communications device 102 may facilitate collaboration between different electrical appliances belonging to a particular consumer. In yet another example, the intelligent communications device 102 may facilitate optimization and collaboration of electricity usage related to a particular electrical appliance, for example, a consumer washing machine.

The transmission aspect may be focused on surveillance, fault management, and/or voltage regulation, among others.

The intelligent communications device 102 includes software and/or applications for monitoring and surveillance, fault management, and/or voltage regulation. Reports of unusual activity detected by the intelligent communications device 102 may be forwarded to a control station or to security staff via alert. The recorded data may be recorded in a log file, which may be forwarded to the concerned authority in real-time for remedial action. Alternatively, the intelligent communications device 102 may, based on its own capability, resolve the issue without raising an alert.

The distribution aspect may include among other aspects monitoring and management of switches, meters, and/or reclosers. The intelligent communications device 102 may allow integration of various devices into seamless smart grid configuration. For example, a meter from one vendor may be configured with the recloser from another vendor. By implementing open standards in the intelligent communications device 102, the distribution companies can focus on building the smart grid infrastructure without worrying about the product working on a dedicated technology, since the intelligent communications device 102 may act as a universal hub for integrating various technologies.

A consumer may utilize the intelligent communications device 102 for conserving electrical consumption. In this aspect, consumer devices may be directly connected with the intelligent communications device 102. Exemplary consumer devices may include transformers, fault management devices, power meters, water meters, gas meters, load limiters, and disconnect switches. The intelligent communications device 102 may manage these smart devices in an optimum manner for saving electricity.

Solar Power

In an embodiment of the present invention, the intelligent communications device 102 may be solar powered. The outer enclosure of the intelligent communications device 102 may be fitted with photovoltaic cells that may receive solar energy. The solar energy may be utilized to charge one or more batteries; the charged batteries may allow communication with utility management infrastructure even during a power failure. Thus, the apparatus may work continuously without interruption.

Solar power may be further utilized to provide power for critical activities during a power failure, such as clock, wireless facility, memory and other communication circuitry.

Computer-Executable Software Embodiments

In an embodiment of the present invention, the intelligent communications device 102 may include software and hardware for implementing virtualization. For example, the intelligent communications device 102 may implement hardware virtualization. Implementing virtualization may facilitate the process of disaster recovery, induce higher levels of abstraction, and increased level of security.

In yet another embodiment of the present invention, the intelligent communications device 102 may include software for implementing distributed computing architecture. For example, various software processes may communicate with databases/repositories of the central control station to periodically update the repositories and/or databases. Such an arrangement may reduce the probability of loss of data during disaster and/or failure of other equipment.

In yet another embodiment of the present invention, the software-implemented multiple processes enable processing of data in real time. In this aspect, the software executed by the associated processor may spawn multiple threads for faster execution and real-time monitoring of the utilities. Such implementation may facilitate quick response to adverse events, thereby reducing the probability of failure of the overall infrastructure.

Figure 3A:
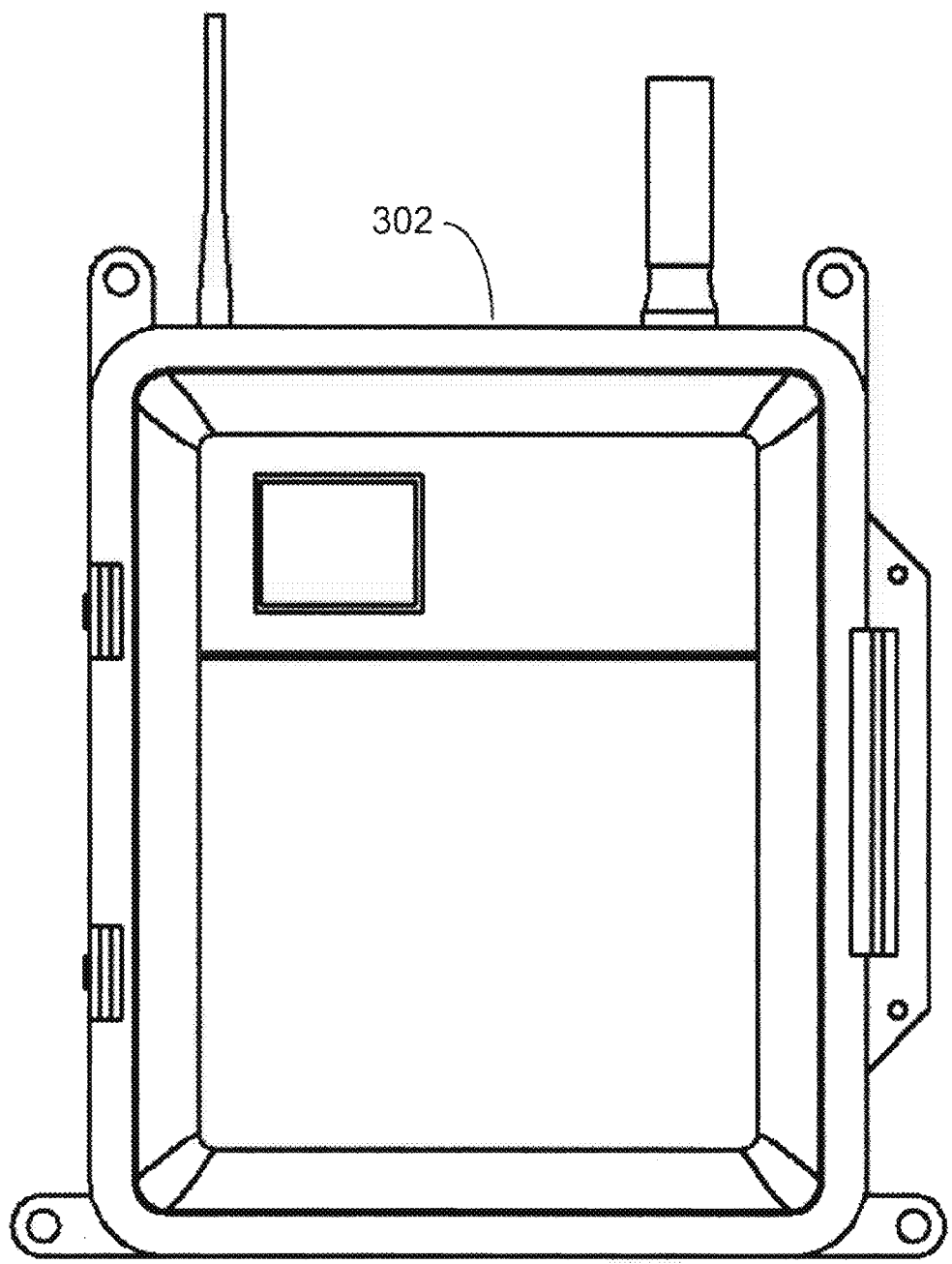
FIG. 3 depicts various modules associated with an intelligent communications device according to one embodiment of the present invention.
Figure 3B:
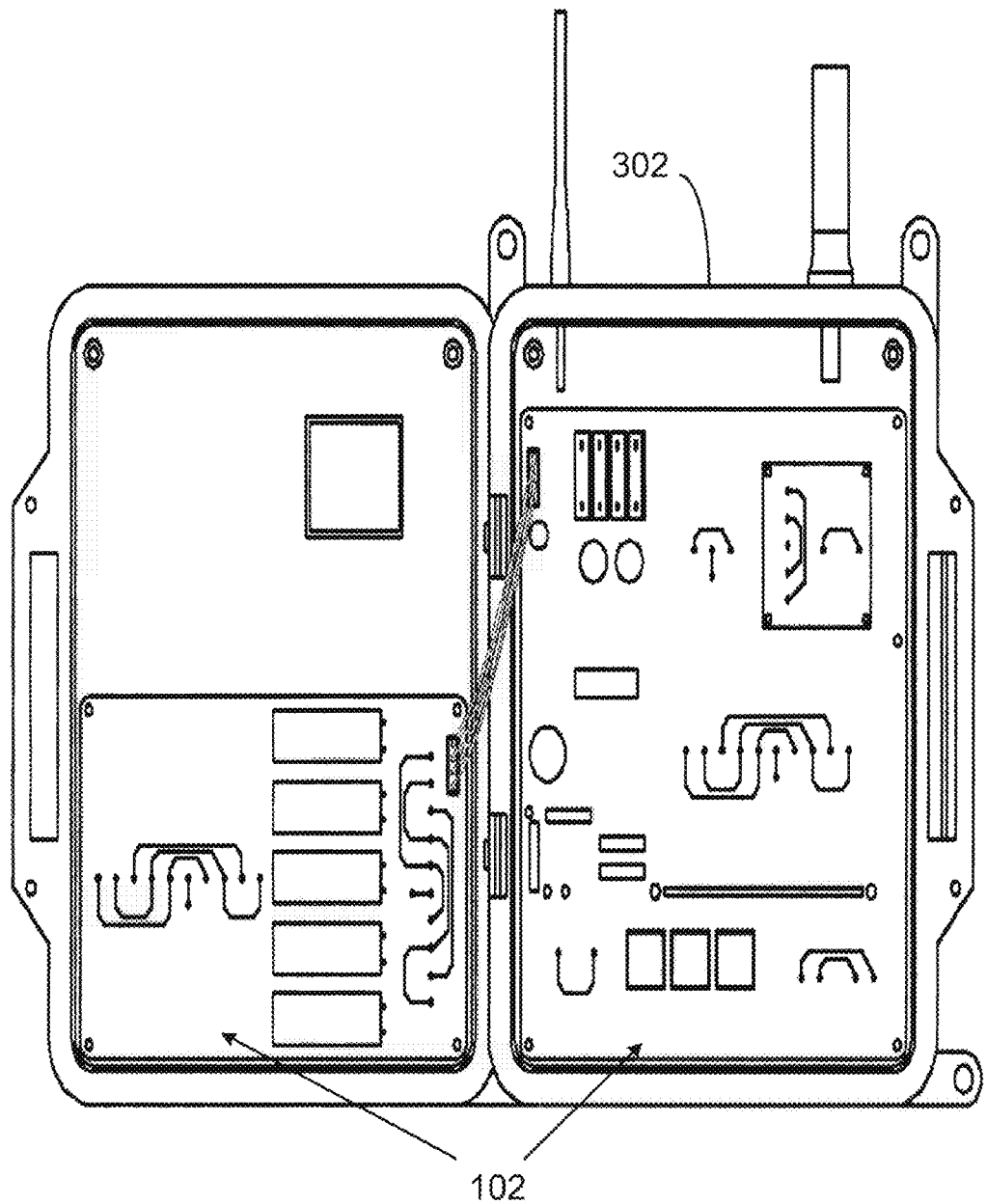
Figure 3C:
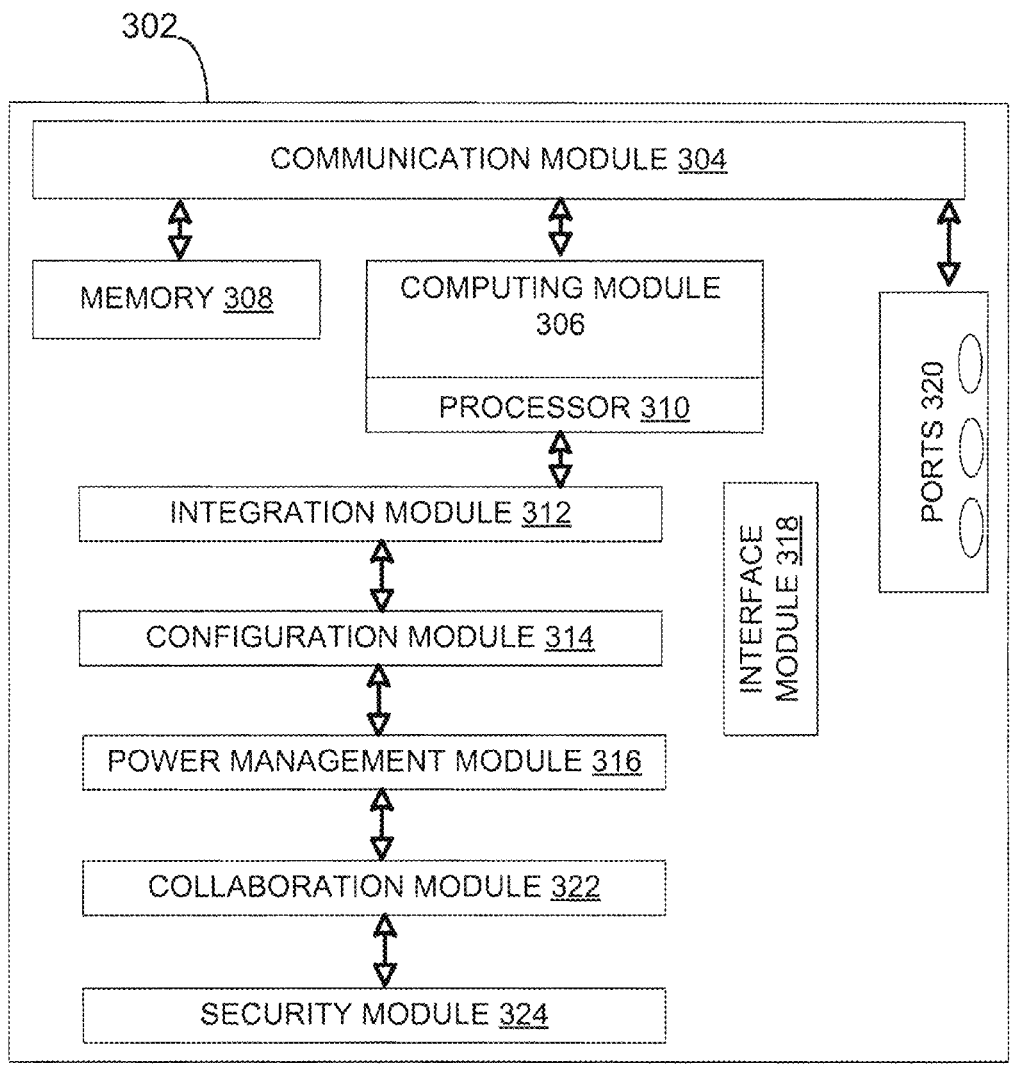

Referring to FIG. 3C, the intelligent communications device 102 may include an enclosure 302, a communication module 304, a memory 308, and a computing module 306 having a processor 310. The communication module 304 may be coupled with the memory 308 and to the computing module 306. In addition, the computing module 306 may be associated with the integration module 312 as well as interface module 318. The smart devices and/or facilities may be attached at one or more ports 320. The data received at one or more ports 320 may be forwarded to an integration module 312, a configuration module 314, a power management module 316, and the collaboration module 322. Additionally, smart devices may be incorporated into the smart grid infrastructure using a collaboration module 322.

In an embodiment of the present invention, addition of a device at one of the ports 320 may initiate integration of the device into the smart grid infrastructure. The signal received from the device may be forwarded to the interface module 318 to determine the type of device, attributes, and other details for integration with the intelligent communications device 102. Once the parameters of the devices have been ascertained, the integration module 312 and the configuration module 314 may facilitate integration for incorporating the device into the smart grid infrastructure. For example, the configuration module 314 may search for device drivers, applications and other software that may enable smooth adaptation of the device into the smart grid infrastructure.

Figure 4:
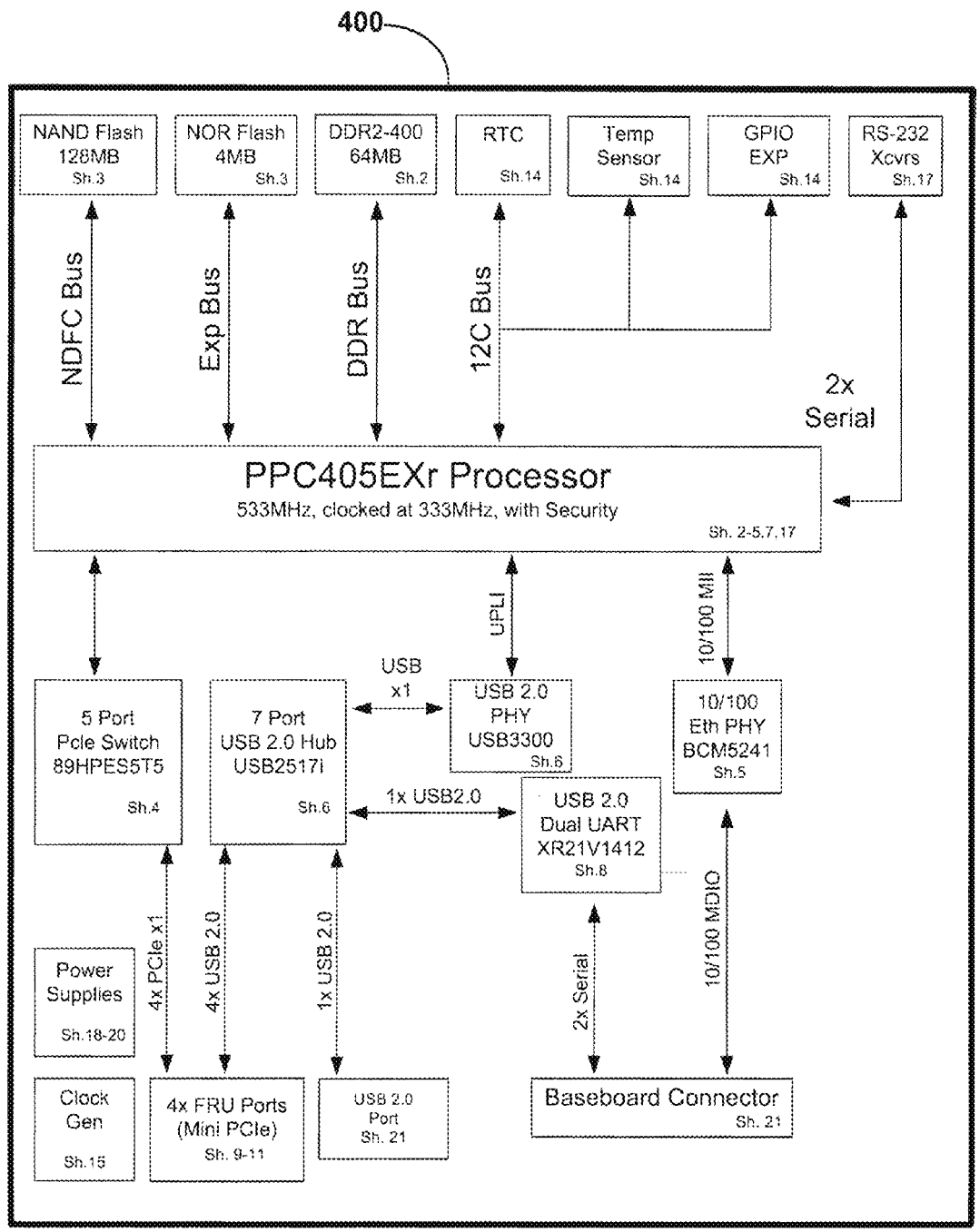
FIG. 4 schematically shows operable circuitry for an intelligent communications device according to one or more embodiments of the present invention.

Referring to FIG. 4, an exemplary outlay 400 of an intelligent communications device 102 is shown, according to one embodiment of the present invention. The internal configuration of the apparatus 400 may include a NAND flash, a NOR flash, a RAM, Temperature sensor, a, RTC, a GPIO, and an interface circuitry such as RS232 coupled to the processor, such as PPC405 EXr Processor. Additionally, a plurality of ports may be interfaced with the processor, such as USB ports, Ethernet ports, switch input connectors, and/or hubs. The circuitry may receive AC/DC power from the power supply, and the power supply may deliver different voltages such as +5V, −5V, +12V, −12V, +15V, −15V and other voltages. Various connectors may be utilized for connecting different type of active and passive components. A clock generation circuitry may be provided for servicing circuits requiring clock pulses.

In an embodiment of the present invention, integrated circuits may be utilized for assembling the embodiment shown in FIG. 4 in association with other active and passive electronic components. Additionally, the circuitry may be laid on a multiple tier PCB for laying the passive and active electronic components and circuits.

Utility-Grade Enclosure

Referring now to FIG. 3A, an outer enclosure 302 associated with the intelligent communications device 102 is shown. The intelligent communications device 102 may be enclosed in proper casing for rapid deployment. In this embodiment, the modular and compact design of the intelligent communications device 102 may protect it from damage during installation. The modular design may further enable rapid installation of the intelligent communications device 102. For example, the compact modular design may facilitate installation of the intelligent communications device 102 within a small space. According to one or more exemplary embodiments of the present invention, the enclosure is utility-grade, meaning that the intelligent communications device 102 complies with ANSI standards for particular equipment connected to a utility facility. For example, ANSI C12 37.90 corresponds to a standard for a surge-withstand test, and C12.1 designates a metering environmental standard. The compact modular design of the enclosure may be modified for installation in hazardous areas such as refineries, gas plants, and CNG stations. Special enclosures may be provided for installing the intelligent communications device 102 in hazardous areas. In an embodiment of the present invention, the casings and/or enclosures may facilitate a long operational lifetime of the intelligent communications device 102.

In embodiments, the enclosure may be fabricated from metal, plastic, and other materials, which may be combined.

The compact modular design of the enclosure may be modified for installation in hazardous areas such as refineries, gas plants, and CNG stations. Special enclosures may be provided for installing the intelligent communications device 102 in hazardous areas. In an embodiment of the present invention, the casings and/or enclosures may facilitate a long operational lifetime of the intelligent communications device 102.

FIG. 3B depicts various circuit boards of the intelligent communications device 102 embedded in the enclosure 302 for safety. The enclosure may include circuitry that may raise an alarm if the enclosure is tampered. Additionally, a provision may be provided in the intelligent communications device 102 that may intelligently determine if the enclosure is opened for repair.

Referring to FIG. 3C, the intelligent communications device 102 may include an enclosure 302, a communication module 304, a memory 308, and a computing module 306 having a processor 310. The communication module 304 may be coupled with the memory 308 and to the computing module 306. In addition, the computing module 306 may be associated with the integration module 312 as well as interface module 318. The smart devices and/or facilities may be attached at one or more ports 320. The data received at one or more ports 320 may be forwarded to an integration module 312, a configuration module 314, a power management module 316, and the collaboration module 322. Additionally, smart devices may be incorporated into the smart grid infrastructure using a collaboration module 322.

Figure 5:
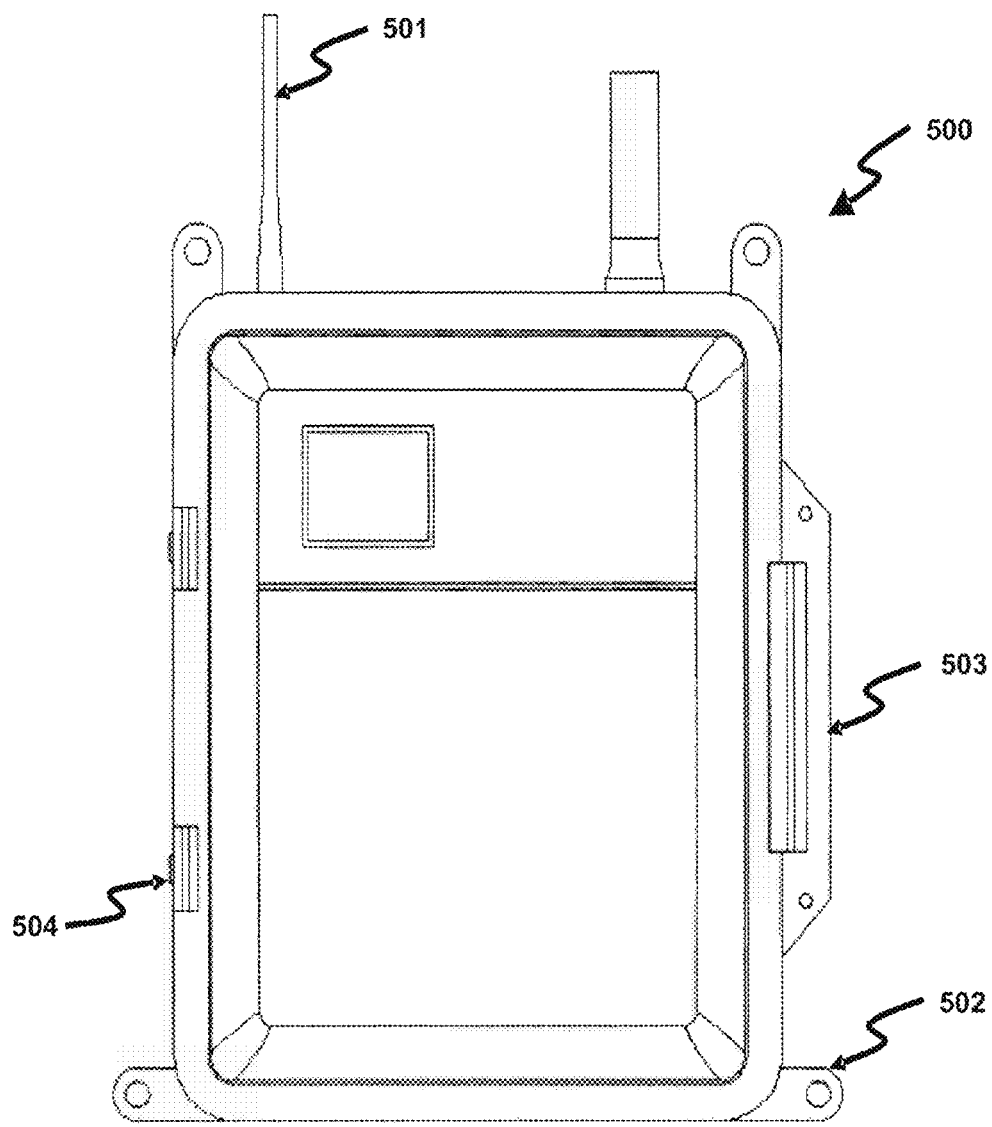
FIG. 5 shows a front view of a closed and sealed utility-grade enclosure in accordance with one embodiment of the present invention.

Referring now to FIG. 5, a front view of a utility-grade enclosure is shown, according to one embodiment of the present invention. In one embodiment, the utility-grade enclosure includes a housing 500 that is substantially cubic in overall shape, and which defines a chamber to receive one or more circuit boards therein. Also, as shown, an antenna 501 is fastened to a top surface of the utility-grade enclosure. Although the housing is shown here as having a substantially cubic shape, the use of other geometric dimensions and arrangements, such as substantially circular arrangements are within the scope of the present invention.

In one embodiment, the housing 500 is formed at least partially from a UV stabilized material that can protect the housing from degradation and deterioration that can result from exposure to direct sunlight, where the intelligent communications device 102 is installed in an outdoor setting. The utility-grade enclosure may also be constructed partially or fully of metal, metal alloys, fiberglass, or a combination of these materials.

In one embodiment, the utility-grade enclosure is partially coated inside with conductive material EMI coating, to improve electrical sensitivity and reception/transmission characteristics for a communication device such as a radio installed within the housing. In one embodiment, the utility-grade enclosure has a National Electrical Manufacturers Association (NEMA) rating of 4x.

As shown in the embodiment of FIG. 5, the utility-grade enclosure is lockable or sealable using a lock mechanism 503. The utility-grade enclosure also has a detachable cover, which may take the form of a hinged door, for covering and sealing the enclosed space defined within the housing. A hinge 504 is provided to facilitate opening and closing of the detachable cover. Also, as shown in the embodiment of FIG. 5, the utility-grade enclosure has mounting ears 502 which facilitate mounting the utility-grade enclosure to a static member using fastening means such as screws. As an example, the static member may be a conventional type of utility pole which extends vertically out of the ground and supports various utility lines and components at a safe separation distance above the ground. Alternatively, the static member may include all or portions of a tower, natural structure, residential structure, or commercial structure.

Figure 6:
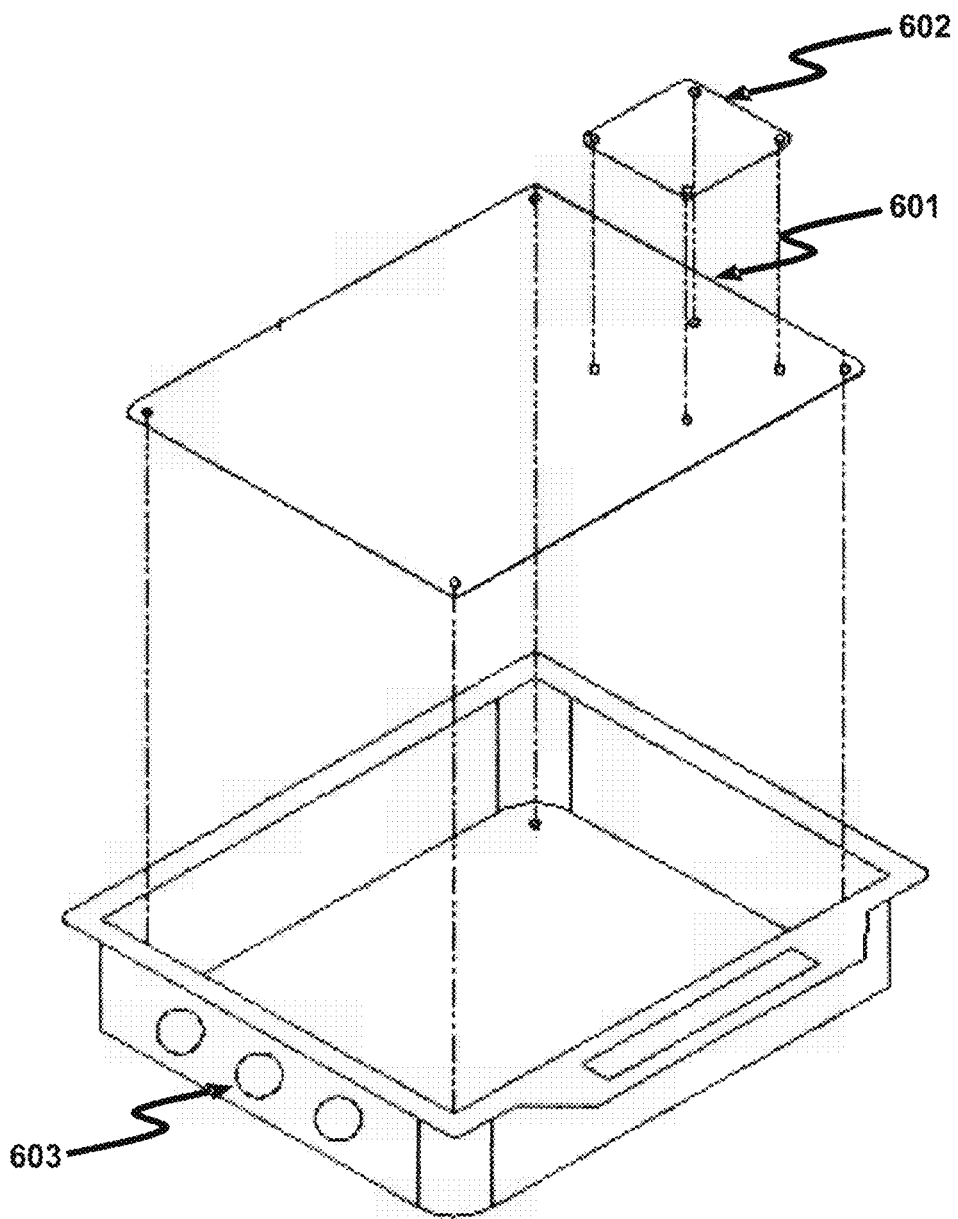
FIG. 6 is an exploded view illustrating the arrangement of a circuit board in a utility-grade enclosure according to one embodiment of the present invention.

FIG. 6 is an exploded view illustrating the arrangement of a circuit board 601 in a utility-grade enclosure according to one embodiment of the present invention. The circuit board 601 is placed in the enclosed space provided within the housing. A plurality of secondary circuit board connectors are configured on the circuit board 601. Secondary expansion cards are operatively connected to the secondary circuit board connector slots. In one embodiment, the circuit board 601 has power supply components including voltage regulators, flyback transformers and/or super capacitor charging balancer(s). The utility-grade enclosure is compatible with a broad range of power supplies for power input to one or more circuit boards within the housing. For example, from 85 volts AC to 277 volts AC, or 130 volts DC, voltage regulators ensure 6.95 V DC output to the secondary expansion cards which operate at a low voltage. In one embodiment, a power path controller is provided on the circuit board 601, having provision of a 6V battery to act as a back-up power source in the event of a power outage. In one embodiment, a circuitry is provided on the circuit board 601 that is operative to determine whether the power supply to the components operating at lower voltage will go from main power supply or backup battery. In one embodiment, there is provision of an intelligent charger for charging the backup battery. Also, in one embodiment, the circuit board has provision of a supplementary power supply. In one embodiment, a ground connection such as a static strap can be provided, to insulate a serviceperson such as a utility worker from electric shock to the worker and to avoid harmful electrical effects from human contact to the board. In one embodiment, the circuit board has a metalized region on the top or bottom of the board strip, to facilitate heat transfer. In this embodiment, the ground plane touches the metalized region and forms a heat path to the combination of ground plane and heat sink at the top of the enclosure. In one embodiment, the circuit board has three or more connectors, such as one or more of RS232, RS485, digital IO, analog 4-20 milliamp, and telephone adapter connectors. As shown in the embodiment of FIG. 6, knockouts 603 are provided on the enclosure housing, to allow for input and output communication/power cables to run into and out of the inside of the enclosure.

In one embodiment, a small board 602 is mounted on the circuit board 601, where the small board is a personality board. The personality board configures two generic RJ45-type connectors which are mounted on the circuit board 601. The personality board determines functioning of the RJ 45 type connectors and allows communication capability to these ports. The personality board also includes a connector which is in communication with a processor. Enclosure architecture according to one or more exemplary embodiments facilitates mounting of the personality board 602 on the circuit board 601.

In one embodiment, the circuit board 601 includes a mounted processor and is operative to allow interfacing to a plurality of different communication devices such as modems and radios. In one embodiment, the circuit board 601 has provision for mounting of four or more secondary circuit board connectors e.g. PCI mini express slots, where the PCIe slots are arranged in such a manner that a double wide card or super size card is connected to the circuit board through the use of two adjacent slots. In one embodiment, the circuit board also includes a SIM card slot. In one embodiment, there is provision for one or more flashing LED lights to be operatively connected and mounted on the circuit board 601. These LEDs, in one embodiment, are activated when the detachable cover of the utility-grade enclosure is opened, and then are deactivated when detachable door is closed. In one embodiment, the activation/deactivation is effected by a mechanical plunger operatively connected inside the housing of the utility-grade enclosure such that, in operation, when the detachable cover is moved from an open position to a closed position, the plunger effects a mechanical pressure to actuate a switch such as to cause deactivation of the LED lights, and, when the detachable cover is moved from a closed position to an open position, mechanical pressure from the plunger is relieved such that the switch is not actuated and the LED lights are activated.

The architecture of one or more embodiments of the utility-grade enclosure of the present invention may serve to provide intelligent communication devices and functional connection to various utility equipments, and/or to provide a platform or framework for third party hardware to be configured upon the circuit board 601 through PCI mini express slots. In one embodiment, the circuit board 601 includes provisions for updating the software such that it is possible to operate a variety of different third party hardware. According to one or more embodiments of the present invention, the circuit board is operative to run applications autonomously, act as a protocol converter, make local decisions for operation of a utility, and/or provide Wi-Fi capability for connecting to remote sites.

Figure 7:
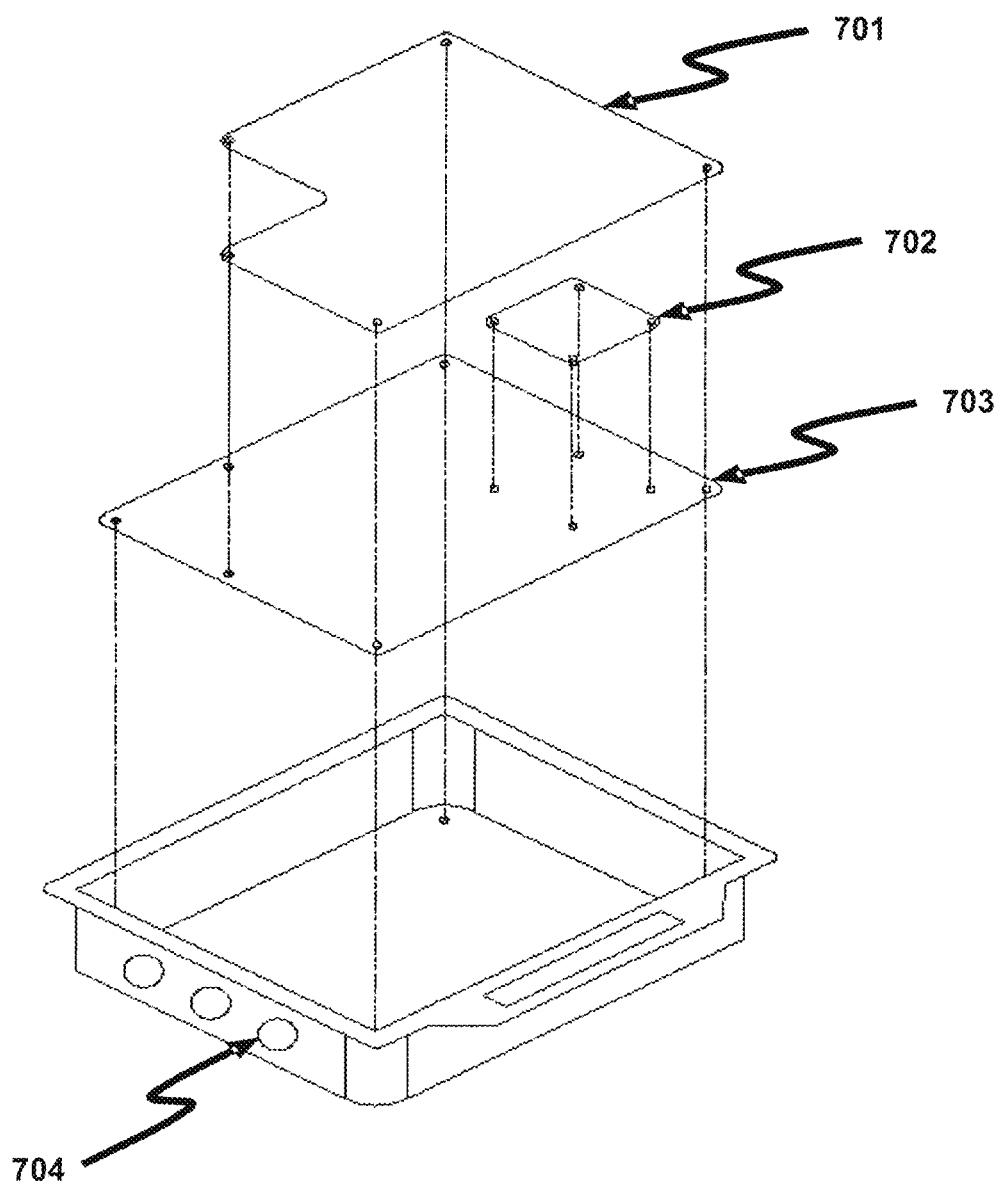
FIG. 7 is an exploded view illustrating the relative arrangement of a plurality of circuit boards in a utility-grade enclosure according to one embodiment of the present invention.

FIG. 7 is an exploded view illustrating the relative arrangement of a plurality of circuit boards in a utility-grade enclosure, according to one embodiment of the present invention. As shown, in one embodiment a first circuit board 703 is placed adjacent to the back wall of the enclosure housing and a personality board 702 is mounted thereon. A second circuit board 701 is mounted on the first circuit board 703 such as to substantially cover the first circuit board 703. As shown, in one embodiment, the housing includes knockouts 704 for allowing communication cables and/or power cables to be run into and out of the housing.

A small board 702 is mounted on the first circuit board 703 or the lower most board, where the small board is a personality board. The personality board configures two generic RJ 45 type connectors which are mounted on the lower board. The personality board determines functioning of the RJ 45 type connectors and allows communication capability to these ports. The personality board also includes a connector which is in communication with a processor. Enclosure architecture according to one or more exemplary embodiments facilitates mounting of the personality board 702 on the circuit board 703.

As shown in FIG. 7, in one embodiment, a second circuit board 701 is mounted on the first circuit board 703, such as to be positioned at the top of the relative stack of the plurality of boards 701, 702, 703. In one embodiment, the second circuit board 701 includes a mounted processor and is operative to allow interfacing to a plurality of different communication devices such as modems and radios. In one embodiment, the second circuit board 701 has provision for mounting four or more PCI mini express slots, where the PCIe slots are arranged in such a manner that a double wide card or a super size card is connected to the second circuit board through the use of two adjacent slots. In one embodiment, the second circuit board 701 also includes a SIM card slot.

In one embodiment, the second circuit board 701 also includes voltage regulators to further reduce the voltage of the input power supplied to electronic components on the second circuit board 701. In one embodiment, there is provision for one or more flashing LEDs to be operatively connected to and mounted on the second circuit board 701. These LEDs, in one embodiment, are activated when the detachable cover of the utility-grade enclosure is opened, and then are deactivated when the detachable door is closed. In one embodiment, the activation/deactivation is effected by a mechanical plunger that is operatively connected inside the housing of the enclosure such that, in operation, when the detachable cover is moved from an open position to a closed position, the plunger provides a mechanical pressure to actuate a switch to cause deactivation of the LEDs, and, when the detachable cover is moved from a closed position to an open position, mechanical pressure from the plunger is relieved such that the switch is not actuated and the LEDs are deactivated accordingly.

In one or more embodiments, the architecture facilitates function of one or more communication devices and operates to operatively connect a variety of intelligent utility equipment. Further, the architecture according to one or more embodiments facilitates compatibility with a broad range of power supplies for power input to the circuit boards within the housing, like from 85 to 277 volt/480 type service, which is particular to a utility environment. Additionally, 130 volt DC batteries may be used.

In one embodiment, the architecture functionally provides a platform or framework for third party hardware to be configured on the second circuit board 701. In one embodiment, the second circuit board 701 includes provisions for updating the software such that it is possible to operate a variety of different third party hardware. According to one or more embodiments, the second circuit board 701 is operative to run applications autonomously, act as a protocol converter, make local decisions for operation of a utility, and/or provide Wi-Fi functionality for connecting to remote sites.

Figure 8:
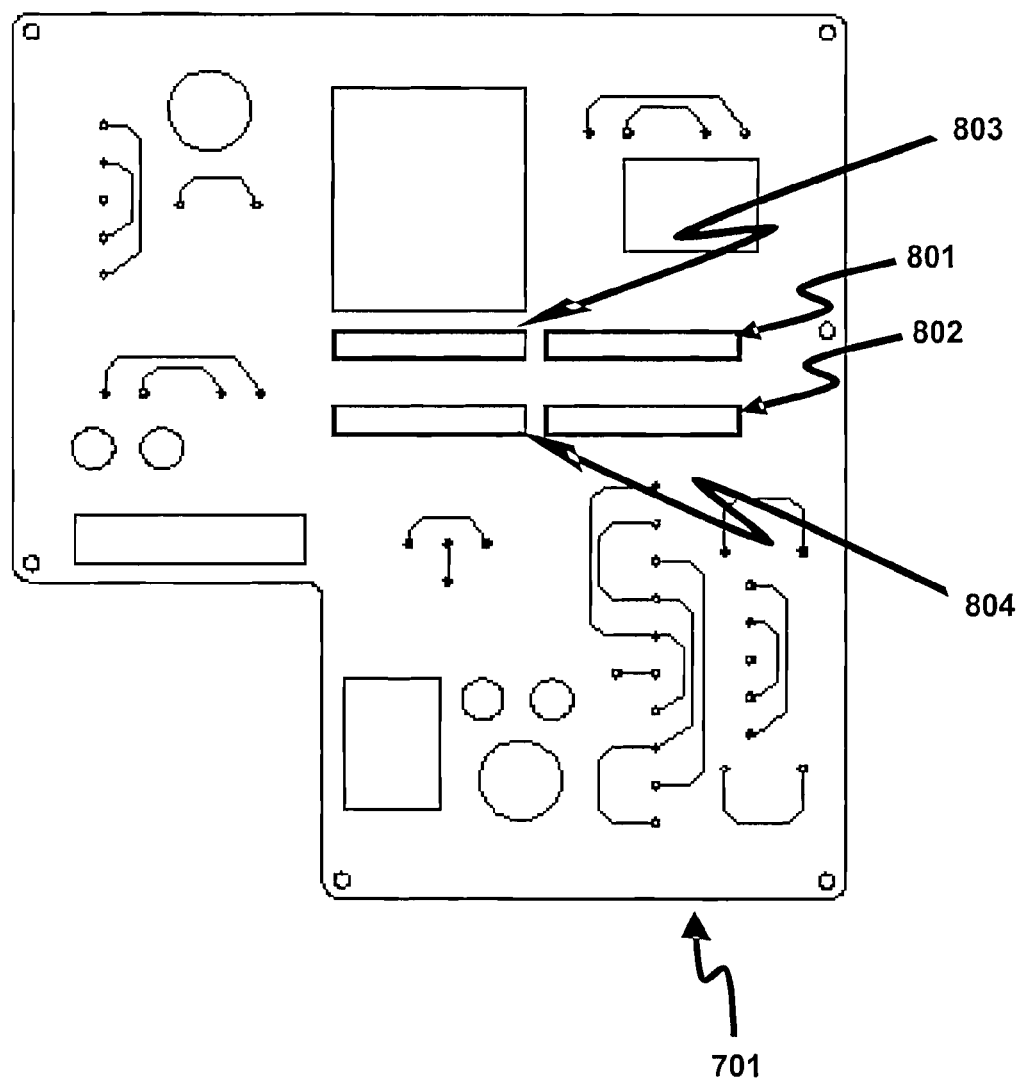
FIG. 8 is an enlarged view of a second circuit board for use in a utility-grade enclosure according to one embodiment of the present invention.

FIG. 8 illustrates various components mounted on the second circuit board 701. Secondary circuit board connectors 801, 802, 803 and 804 are configured on the second circuit board 701. The secondary circuit board connectors are configured on a central location of the circuit board 701 in first and second pairs. The first and second pairs of secondary circuit board connectors are configured in a spaced apart arrangement such that expansion cards having different size and dimensions can be inserted in the provided secondary circuit board connector slot/s.

Figure 9:
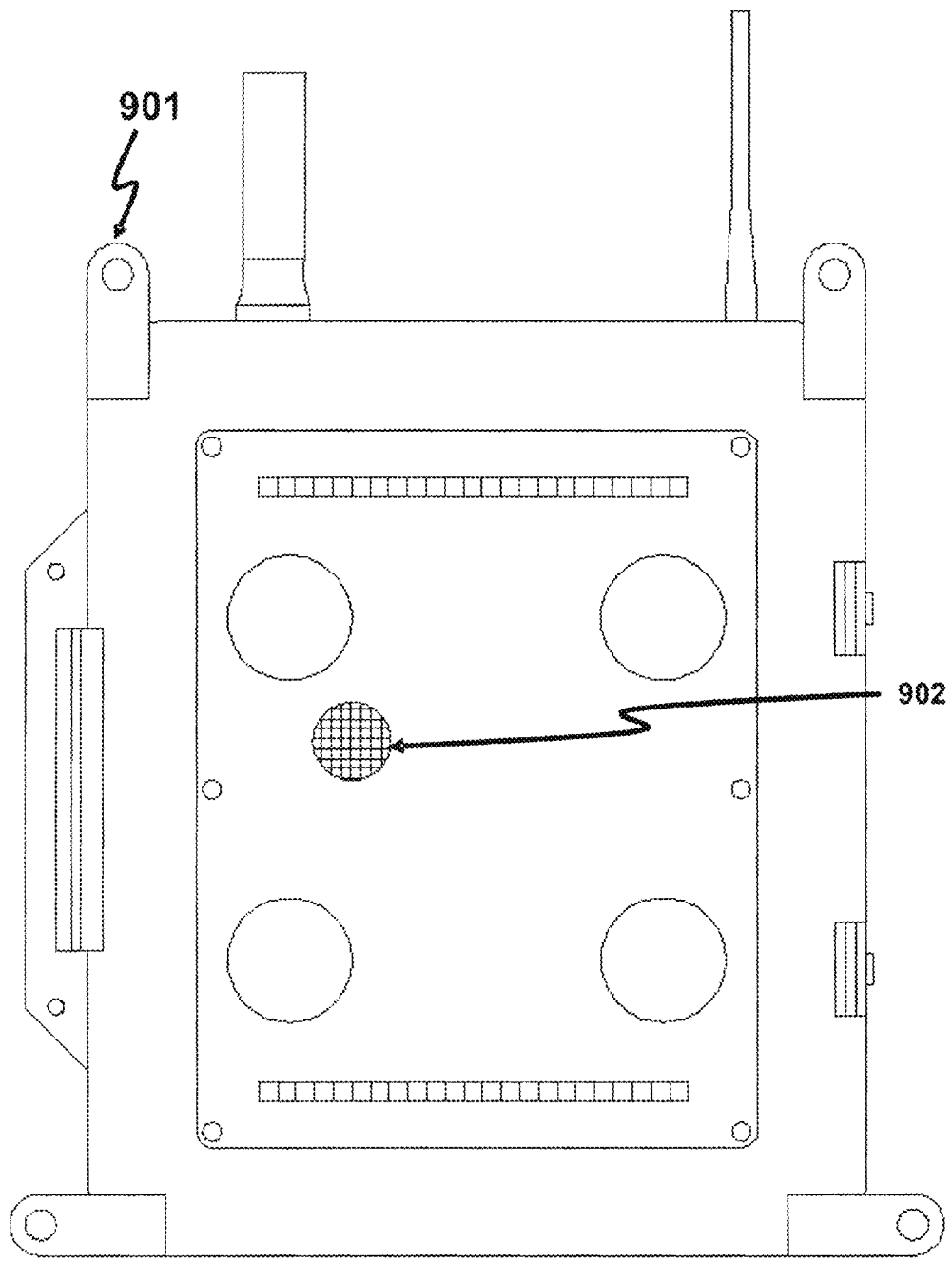
FIG. 9 shows a back view of a utility-grade enclosure according to one embodiment of the present invention.

FIG. 9 illustrates back view of the enclosure. As shown, in one embodiment, mounting ears 901 having screw holes can be fastened to the enclosure using pole mounting brackets, to allow the enclosure to be mounted to a static member. The static member may be a standard utility pole, or may include all or portions of a utility tower, natural structure, residential structure, or commercial structure.

As shown in FIG. 9, in one embodiment the enclosure has a semi permeable membrane 902 in the back wall of the enclosure which functions as a one-way membrane to allow escape of moisture such as water vapor from inside the enclosure to the external environment.

The methods described herein may be deployed in part or in whole through one or more devices that are capable of executing computer software, program codes, and/or instructions on corresponding processors. A processor may be part of a server, client, network infrastructure, mobile computing platform, stationary computing platform, or other computing platform. The processor may be any kind of computational or processing device capable of executing program instructions, codes, and/or binary instructions. The processor may be or may include a signal processor, a digital processor, an embedded processor, a microprocessor or any variant such as a co-processor (e.g. a math co-processor, a graphic co-processor, and/or a communication co-processor), that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program and instructions are described herein may be implemented in one or more threads. A thread may spawn other threads that may have assigned priorities associated with them; the processor may execute these threads based on a priority or any other order based on instructions provided in the program code. The processor may include memory that stores methods, codes, instructions, and programs as described herein and elsewhere. The processor may access a storage medium through an interface that may store methods, codes, and instructions as described herein and elsewhere. The storage medium associated with the processor for storing methods, programs, codes, program instructions or other types of instructions capable of being executed by the computing or processing device may include, but may not be limited to, one or more of a CD-ROM, DVD, memory, hard disk, flash drive, RAM, ROM, and/or cache.

The processor may include one or more cores that may enhance speed and performance of a multiprocessor. In embodiments, the process may be a dual core processor, quad core processors, or other chip-level multiprocessors that combine two or more processors.

The methods and systems described herein may transform physical and/or or intangible items from one state to another. The methods and systems described herein may also transform data representing physical and/or intangible items from one state to another.

The elements described and depicted herein, including the elements described in flow charts and block diagrams throughout the figures, imply logical boundaries between the elements. However, according to software or hardware engineering practices, the depicted elements and the functions thereof may be implemented on machines through computer executable media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipments, servers, and/or routers. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a general purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application-specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, each method described above and combinations thereof may be embodied in computer executable code that, when executing on one or more computing devices, performs steps thereof. In another aspect, the methods may be embodied in systems that perform steps thereof, and may be distributed across devices in a number of ways, or all of the functionality may be integrated into a dedicated, standalone device or other hardware. In another aspect, the means for performing steps associated with the processes described above may include any of the hardware and/or software described above. All such permutations and combinations are intended to fall within the scope of the present disclosure.

While the invention has been disclosed in connection with the preferred embodiments shown and described in detail, various modifications and improvements thereon will become readily apparent to those skilled in the art. Accordingly, the spirit and scope of the present invention is not to be limited by the foregoing examples.

What is claimed is:

1. An enclosure for electronic circuit boards and components, comprising:
   a closable, weather-resistant housing that is sized and shaped to receive mounted circuitry in an enclosed space defined by a back wall and side walls extending outwardly from the back wall, the housing comprising a detachable cover for covering and sealing the enclosed space, wherein the circuitry comprises
      at least one planar electronic circuit board mounted within the enclosed space, the at least one planar electronic circuit board comprising
      a subsection of power supply circuitry operative to receive electrical power from outside the enclosure,
      a plurality of power supply transformers and capacitors operating from power received from outside the housing, and
      data processing and communications components comprising at least a data processor and a data bus, the data bus coupled to a plurality of electronic circuit connectors operative to couple the at least one electronic circuit board thereto and configured such that the at least one electronic circuit board is exposed to an external environment when the cover is detached.

2. The enclosure of claim 1, wherein the at least one planar electronic circuit board comprises a pair of planar electronic circuit boards mounted in a parallel configuration within the enclosed space, with a first circuit board contained entirely within the enclosed space adjacent to the back wall, and a second circuit board mounted parallel to the first circuit board in the enclosed space above the first circuit board so as to substantially shield and cover circuitry on the first circuit board when the cover is detached,
   wherein the first circuit board comprises the subsection of power supply circuitry operative to receive power from outside the enclosure, the subsection further operative to provide electrical power at a first reduced power to a second subsection of power supply circuitry contained on the second circuit board via an electrical power connector, wherein the first subsection comprises power supply transformers and capacitors operating from power received from outside the housing, and
   wherein the second circuit board comprises an additional subsection of power supply circuitry operative to receive electrical power and provide electrical power to circuitry contained exclusively on the second circuit board, and further comprises the data processing and communications components.

3. The enclosure of claim 1, wherein the enclosure has a NEMA rating of 4× or greater.

4. The enclosure of claim 1, wherein the enclosure is comprised at least partially of UV stable material.

5. The enclosure of claim 1, wherein the enclosure is comprised at least partially of metal.

6. The enclosure of claim 1, wherein the enclosure further comprises a semi-permeable membrane operative to allow escape of water vapor from inside of the enclosure to the external environment.

7. The enclosure of claim 1, wherein the detachable cover comprises an attached hinge connected to the housing and operative to allow the cover to swing open from a sealed position to an open position along a rotation axis defined by the hinge such as to expose the mounted circuitry to the external environment, and further operative to allow the cover to swing closed to the sealed position along the rotation axis.

8. The enclosure of claim 1, wherein one or more of the back wall, side walls, and internal wall of the hinged cover is coated at least partially with conductive EMI coating.

9. The enclosure of claim 1, wherein the housing is configured to be operatively connected to mounting components allowing the housing to be mounted to a static member.

10. The enclosure of claim 1, wherein the enclosure is configured to enclose an intelligent communication device for a smart grid, operative to perform network communication routing.

11. The enclosure of claim 10, wherein the intelligent communication device is communicatively coupled to one or more separate intelligent utility devices in the smart grid.

12. The enclosure of claim 2, wherein the first and second circuit boards are operative to serve as a communication platform for one or more utilities.

13. The enclosure of claim 2, wherein at least one of the plurality of electronic circuit connectors comprises a circuit board slot operative to receive and operatively connect a corresponding at least one of the plurality of electronic circuit boards.

14. The enclosure of claim 2, further comprising a combined ground plane and heat sink.

15. The enclosure of claim 14, wherein the combined ground plane and heat sink is thermally coupled to a plate located on top of the first circuit board that is operative to transfer heat.

16. The enclosure of claim 2, wherein the first circuit board receives a plurality of types of power inputs.

17. The enclosure of claim 2, wherein the first circuit board comprises a power path controller configured to allow for a supplementary power supply to be operatively connected to the second circuit board.

18. The enclosure of claim 2, wherein the first circuit board comprises circuitry that is operative to select between a main power supply and a supplementary power supply.

19. The enclosure of claim 2, wherein the first circuit board comprises an intelligent charger operative to charge a supplementary power supply source.

20. The enclosure of claim 2, wherein the second circuit board is configured to serve as a platform for third party software and hardware development.

21. The enclosure of claim 13, wherein the at least one electronic circuit board slot comprises a hardware expansion slot.

22. The enclosure of claim 21, wherein the hardware expansion slot comprises a PCIe slot.

23. The enclosure of claim 2, wherein the second circuit board comprises at least one LED.

24. An enclosure for electronic circuit boards and components, the enclosure comprising:
   a weather-resistant housing sized and shaped to receive mounted circuitry in an enclosed space defined by a back wall and side walls, the housing comprising a detachable cover for covering and sealing the enclosed space, wherein the circuitry comprises
   a plurality of planar electronic circuit boards mounted within the enclosed space, the plurality of planar electronic circuit boards comprising
   a subsection of power supply circuitry operative to receive electrical power from outside the enclosure,
   a plurality of power supply transformers and capacitors operating from power received from outside the housing, and
   data processing and communications components comprising at least a data processor and a data bus, the data bus coupled to a plurality of electronic circuit connector slots operative to couple at least one of the plurality of planar electronic circuit boards thereto such that at least one of the coupled planar electronic circuit boards is physically accessible from an external environment when the cover is detached.

25. The enclosure of claim 24, wherein the plurality of planar electronic circuit boards comprises a pair of planar electronic circuit boards mounted in a parallel configuration within the enclosed space, with a first circuit board contained entirely within the enclosed space adjacent to the back wall, and a second circuit board mounted parallel to the first circuit board in the enclosed space above the first circuit board so as to substantially shield and cover circuitry on the first circuit board when the cover is detached, wherein the first circuit board comprises the subsection of power supply circuitry operative to receive power from outside the enclosure, the subsection further operative to provide electrical power at a first reduced power to a second subsection of power supply circuitry contained on the second circuit board via an electrical power connector, wherein the first subsection comprises power supply transformers and capacitors operating from power received from outside the housing, and wherein the second circuit board comprises an additional subsection of power supply circuitry operative to receive electrical power and provide electrical power to circuitry contained exclusively on the second circuit board, and further comprises the data processing and communications components.

26. The enclosure of claim 24, wherein the enclosure has a NEMA rating of 4× or greater.

27. The enclosure of claim 24, wherein the enclosure is comprised at least partially of UV stable material.

28. The enclosure of claim 24, wherein the enclosure is comprised at least partially of metal.

29. The enclosure of claim 24, wherein the enclosure further comprises a semi-permeable membrane operative to allow escape of water vapor from inside of the enclosure to the external environment.

30. The enclosure of claim 24, wherein the detachable cover comprises an attached hinge connected to the housing and operative to allow the cover to swing open from a sealed position to an open position along a rotation axis defined by the hinge such as to expose the mounted circuitry to the external environment, and further operative to allow the cover to swing closed to the sealed position along the rotation axis.

31. The enclosure of claim 24, wherein one or more of the back wall, side walls, and internal wall of the housing cover is coated at least partially with conductive EMI coating.

32. The enclosure of claim 24, wherein the housing is configured to be operatively connected to mounting components allowing the housing to be mounted to a static member external to and separate from the enclosure.

33. The enclosure of claim 24, wherein the enclosure is configured to enclose an intelligent communication device for a smart grid, operative to perform network communication routing.

34. The enclosure of claim 33, wherein the intelligent communication device is communicatively coupled to one or more separate intelligent utility devices in the smart grid.

35. The enclosure of claim 25, wherein the first and second circuit boards are operative to serve as a communication platform for one or more utilities.

36. The enclosure of claim 25, wherein at least one of the first and second circuit boards has provision to be operatively connected to electrical edge connectors.

37. The enclosure of claim 25, further comprising a combined ground plane and heat sink.

38. The enclosure of claim 37, wherein the combined ground plane and heat sink is thermally coupled to a plate located on top of the first circuit board that is operative to transfer heat.

39. The enclosure of claim 25, wherein the first circuit board is configured to receive a plurality of types of power inputs.

40. The enclosure of claim 25, wherein the first circuit board comprises a power path controller configured to allow for a supplementary power supply to be operatively connected to the second circuit board.

41. The enclosure of claim 25, wherein the first circuit board comprises circuitry that is operative to select between a main power supply and a supplementary power supply.

42. The enclosure of claim 25, wherein the first circuit board comprises an intelligent charger operative to charge a supplementary power supply source.

43. The enclosure of claim 25, wherein the second circuit board is configured to serve as a platform for third party software and hardware development.

44. The enclosure of claim 25, wherein the plurality of electronic circuit connector slots comprises at least one hardware expansion slot operative to receive and couple a detachable expansion card.

45. The enclosure of claim 44, wherein the at least one hardware expansion slot comprises a PCIe slot.

46. The enclosure of claim 25, wherein the second circuit board comprises at least one LED.

47. The enclosure of claim 32, wherein the static member comprises a utility pole.

* * * * *